(12) United States Patent
Kim et al.

(10) Patent No.: US 9,190,450 B2
(45) Date of Patent: Nov. 17, 2015

(54) LIGHT EMITTING DEVICE PACKAGE INCLUDING A SUBSTRATE HAVING AT LEAST TWO RECESSED SURFACES

(71) Applicant: LG INNOTEK CO., LTD., Seoul (KR)

(72) Inventors: Geun-Ho Kim, Seoul (KR); Yu Ho Won, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/508,790

(22) Filed: Oct. 7, 2014

(65) Prior Publication Data

US 2015/0021646 A1 Jan. 22, 2015

Related U.S. Application Data

(63) Continuation of application No. 14/021,577, filed on Sep. 9, 2013, now Pat. No. 8,878,229, which is a continuation of application No. 13/347,475, filed on Jan. 10, 2012, now Pat. No. 8,592,855, which is a continuation of application No. 13/165,741, filed on Jun. 21, 2011, now Pat. No. 8,125,000, which is a continuation of application No. 12/470,787, filed on May 22, 2009, now Pat. No. 7,982,237.

(30) Foreign Application Priority Data

May 23, 2008 (KR) ........................ 10-2008-0048241

(51) Int. Cl.
 *H01L 27/15* (2006.01)
 *H01L 33/62* (2010.01)
 (Continued)

(52) U.S. Cl.
 CPC .............. *H01L 27/15* (2013.01); *H01L 29/866* (2013.01); *H01L 33/486* (2013.01); *H01L 33/507* (2013.01); *H01L 33/62* (2013.01);
 (Continued)

(58) Field of Classification Search
 CPC ....... H01L 27/15; H01L 33/507; H01L 33/62; H01L 29/866
 See application file for complete search history.

(56) References Cited

U.S. PATENT DOCUMENTS 5,032,896 A 7/1991 Little et al.
5,291,038 A 3/1994 Hanamoto et al.
(Continued)

FOREIGN PATENT DOCUMENTS

CN 1691360 4/2005
CN 101101944 A 1/2008
(Continued)

OTHER PUBLICATIONS

Chinese Office Action dated Apr. 26, 2012.
(Continued)

*Primary Examiner* — Ida M Soward
(74) *Attorney, Agent, or Firm* — Birch, Stewart, Kolasch & Birch, LLP

(57) ABSTRACT

A light emitting device package is disclosed, which includes a first via hole and a second via hole disposed lower than a light emitting part, the first via hole and the second via hole are disposed at an outer area of the light emitting part, a bottom metal includes a first bottom metal, a second bottom metal, and a third bottom metal between the first bottom metal and the second bottom metal, a first conductive metal electrically connected to the first bottom metal through the first via hole and a second conductive metal electrically connected to the second bottom metal through the second via hole. Further, the first bottom metal, the second bottom metal are apart from the third bottom metal at a bottom surface of the substrate, and the third bottom metal is not electrically connected to the second conductive type metal layer.

20 Claims, 6 Drawing Sheets

Related U.S. Application Data

(51) Int. Cl.
 *H01L 33/50* (2010.01)
 *H01L 29/866* (2006.01)
 *H01L 33/48* (2010.01)
 *H01L 33/60* (2010.01)

(52) U.S. Cl.
 CPC .............. *H01L 33/50* (2013.01); *H01L 33/60* (2013.01); *H01L 2924/0002* (2013.01)

(56) References Cited

U.S. PATENT DOCUMENTS

| | | | |
|---|---|---|---|
| 5,298,768 A * | 3/1994 | Okazaki et al. | 257/81 |
| 5,474,958 A | 12/1995 | Djennas et al. | |
| 5,559,918 A | 9/1996 | Furuyama et al. | |
| 6,313,525 B1 | 11/2001 | Sasano | |
| 6,496,162 B2 * | 12/2002 | Kawakami et al. | 345/46 |
| 6,531,328 B1 | 3/2003 | Chen | |
| 6,600,231 B2 | 7/2003 | Tominaga | |
| 6,835,960 B2 | 12/2004 | Lin et al. | |
| 6,883,933 B2 | 4/2005 | Matsui et al. | |
| 7,183,587 B2 | 2/2007 | Negley et al. | |
| 7,242,092 B2 | 7/2007 | Hsu | |
| 7,258,816 B2 | 8/2007 | Tamaki et al. | |
| 7,268,014 B2 | 9/2007 | Lee et al. | |
| 7,411,225 B2 | 8/2008 | Kim et al. | |
| 7,435,997 B2 | 10/2008 | Arndt et al. | |
| 7,462,870 B2 | 12/2008 | Nakashima | |
| 7,491,981 B2 | 2/2009 | Yamaguchi et al. | |
| 7,494,898 B2 | 2/2009 | Sunohara et al. | |
| 7,495,322 B2 | 2/2009 | Hashimoto et al. | |
| 7,521,724 B2 | 4/2009 | Chen et al. | |
| 7,547,923 B2 | 6/2009 | Shin et al. | |
| 7,551,141 B1 | 6/2009 | Hadley et al. | |
| 7,579,629 B2 | 8/2009 | Inoguchi | |
| 7,579,926 B2 | 8/2009 | Jhung | |
| 7,605,405 B2 | 10/2009 | Harada et al. | |
| 7,652,381 B2 | 1/2010 | Grundy et al. | |
| 7,655,500 B2 | 2/2010 | Jiang et al. | |
| 7,699,500 B2 | 4/2010 | Takemoto et al. | |
| 7,714,341 B2 * | 5/2010 | Chil Keun et al. | 257/98 |
| 7,719,099 B2 * | 5/2010 | Tseng et al. | 257/690 |
| 7,723,736 B2 | 5/2010 | Lee et al. | |
| 7,744,244 B2 | 6/2010 | Huang | |
| 7,826,695 B2 | 11/2010 | Shibayama | |
| 7,851,817 B2 * | 12/2010 | Yasuda et al. | 257/98 |
| 7,868,332 B2 | 1/2011 | Rho et al. | |
| 7,868,345 B2 | 1/2011 | Mori et al. | |
| 7,888,869 B2 | 2/2011 | Tanda et al. | |
| 7,906,793 B2 | 3/2011 | Negley | |
| 8,193,547 B2 | 6/2012 | Loh et al. | |
| 8,324,723 B2 | 12/2012 | Lin et al. | |
| 8,352,003 B2 | 1/2013 | Sawada et al. | |
| 2003/0038292 A1 | 2/2003 | Wang et al. | |
| 2004/0256706 A1 | 12/2004 | Nakashima | |
| 2005/0029535 A1 | 2/2005 | Mazzochette et al. | |
| 2005/0072981 A1 | 4/2005 | Suenaga | |
| 2005/0073846 A1 | 4/2005 | Takine | |
| 2005/0087866 A1 | 4/2005 | Shei et al. | |
| 2005/0205876 A1 | 9/2005 | Harada et al. | |
| 2005/0221518 A1 | 10/2005 | Andrews et al. | |
| 2005/0253153 A1 | 11/2005 | Harada | |
| 2006/0001055 A1 | 1/2006 | Ueno et al. | |
| 2006/0049475 A1 | 3/2006 | Wang et al. | |
| 2006/0097385 A1 | 5/2006 | Negley | |
| 2006/0099449 A1 | 5/2006 | Amano et al. | |
| 2006/0226759 A1 | 10/2006 | Masuda et al. | |
| 2007/0031992 A1 | 2/2007 | Schatz | |
| 2007/0080420 A1 | 4/2007 | Kim et al. | |
| 2007/0241342 A1 | 10/2007 | Inoue et al. | |
| 2008/0006837 A1 | 1/2008 | Park et al. | |
| 2008/0029775 A1 | 2/2008 | Liu et al. | |
| 2008/0038854 A1 | 2/2008 | Choi et al. | |
| 2008/0067537 A1 | 3/2008 | Kolodin et al. | |
| 2008/0142832 A1 | 6/2008 | Chen et al. | |
| 2008/0149962 A1 | 6/2008 | Kim et al. | |
| 2008/0224162 A1 | 9/2008 | Min et al. | |
| 2008/0237621 A1 | 10/2008 | Takemoto | |
| 2008/0303157 A1 | 12/2008 | Cheng et al. | |
| 2009/0023234 A1 | 1/2009 | Hsu et al. | |
| 2009/0039762 A1 | 2/2009 | Park et al. | |
| 2009/0134421 A1 | 5/2009 | Negley | |
| 2010/0102349 A1 | 4/2010 | Hata | |
| 2010/0252842 A1 | 10/2010 | Tsang et al. | |
| 2011/0180833 A1 | 7/2011 | Jang et al. | |

FOREIGN PATENT DOCUMENTS

| | | |
|---|---|---|
| EP | 1821348 A2 | 8/2007 |
| JP | 7-15046 A | 1/1995 |
| JP | 8-274378 A | 10/1996 |
| JP | 2001-257410 A | 9/2001 |
| JP | 2003-318448 A | 11/2003 |
| JP | 2004-71726 A | 3/2004 |
| JP | 2004-111937 A | 4/2004 |
| JP | 2004-207542 A | 7/2004 |
| JP | 2004-228240 A | 8/2004 |
| JP | 2004-253711 A | 9/2004 |
| JP | 2004-281994 A | 10/2004 |
| JP | 2004-327503 A | 11/2004 |
| JP | 2004-327504 A | 11/2004 |
| JP | 2006-114854 A | 4/2006 |
| JP | 2006-185967 A | 7/2006 |
| JP | 2007-207895 A | 8/2007 |
| JP | 2007-231253 A | 9/2007 |
| JP | 2007-234846 A | 9/2007 |
| JP | 2007-262375 A | 10/2007 |
| JP | 2007-273592 A | 10/2007 |
| JP | 2007-273754 A | 10/2007 |
| JP | 2007-305703 A | 11/2007 |
| JP | 2008-34550 A | 2/2008 |
| JP | 2008-041968 A | 2/2008 |
| JP | 2008-53702 A | 3/2008 |
| JP | 2008-72092 A | 3/2008 |
| KR | 2002-0037623 A | 5/2002 |
| KR | 10-2006-0004504 A | 1/2006 |
| KR | 100600411 B1 | 7/2006 |
| KR | 2007-0095665 A | 10/2007 |
| KR | 10-2008-0004931 A | 1/2008 |
| WO | 2006/046655 A1 | 5/2006 |

OTHER PUBLICATIONS

English Abstract and Translation of JP2007-231253A.
English Abstract and Translation of JP2007-234846.
English Abstract and Translation of JP2008-041968A.
English Abstract and Translation of KR2002-0037623.
English Abstract and Translation of KR2007-0095665.
English Translation of 2001257410A.
English Translation of 2004207542A.
English Translation of 2004228240A.
English Translation of 2004253711A.
English Translation of 2004281994A.
English Translation of 2004327503A.
English Translation of 2004327504A.
English Translation of 2006185967A.
English Translation of 2007207895A.
English Translation of 2007262375A.
English Translation of 2007273592A.
English Translation of 2007273754A.
English Translation of 2008034550A.
English Translation of 2008053702A.
Full machine-generated English translation for JP-2003-318448-A.
Full machine-generated English translation for JP-2004-111937-A.
Full machine-generated English translation for JP-2007-305703-A.
International Search Report dated Nov. 13, 2009.
Notice of Allowance issued in U.S. Appl. No. 13/347,745 on Oct. 2, 2013.

* cited by examiner

LIGHT EMITTING DEVICE PACKAGE INCLUDING A SUBSTRATE HAVING AT LEAST TWO RECESSED SURFACES

This application is a continuation of co-pending U.S. application Ser. No. 14/021,577 filed on Sep. 9, 2013 which is a continuation of U.S. application Ser. No. 13/347,475 filed on Jan. 10, 2012, now U.S. Pat. No. 8,592,855 which is a continuation of U.S. application Ser. No. 13/165,741 filed on Jun. 21, 2011, now U.S. Pat. No. 8,125,000 which is a continuation of U.S. application Ser. No. 12/470,787 filed on May 22, 2009, now U.S. Pat. No. 7,982,237 and which claims the benefit under 35 U.S.C. §119 of Korean Patent Application No. 10-2008-0048241, filed May 23, 2008, which are hereby incorporated by reference for all purpose as if fully set forth herein.

BACKGROUND

The embodiment relates to a light emitting device package.

A light emitting device (LED) is a semiconductor device to convert a current into a light. Since a red LED has been commercialized, the red LED, together with a green LED, is used as a light source of electronic devices including information communication equipment.

The light emitting device package includes a light emitting part and a phosphor. In this case, the light emitting part emits light having a first wavelength and the phosphor emits light having a second wavelength, so that the light emitting device package emitting white light can be realized. However, since the light emitted from the phosphor is absorbed into the light emitting part, light efficiency may be reduced. In addition, color deviation may occur due to the difference of optical paths of the light emitted from the light emitting part and transmitted to the phosphor.

BRIEF SUMMARY

The embodiment provides a light emitting device package capable of improving light efficiency and reducing color deviation.

According to the embodiments, a light emitting device package includes a semiconductor substrate comprising a first surface at a first depth from an upper surface of the semiconductor substrate and a second surface at a second depth from the first surface; and a light emitting part on the second surface of the semiconductor substrate.

According to the embodiments, a light emitting device package includes a semiconductor substrate comprising a groove having a multi-layer structure; a light emitting part in the groove of the semiconductor substrate; a first conductive layer electrically connected to a first electrode of the light emitting part; and a second conductive layer electrically connected to a second electrode of the light emitting part.

According to the embodiments, a light emitting device package includes a substrate comprising a recess; a light emitting chip on the substrate; and a first conductive layer electrically connected to the light emitting chip, wherein the first conductive layer comprises at least one metal layer electrically connected to the light emitting chip on an outer circumference of the substrate.

The light emitting device package according to the embodiment can improve light efficiency and can reduce color deviation.

DETAILED DESCRIPTION OF THE EMBODIMENTS

Figure 1:
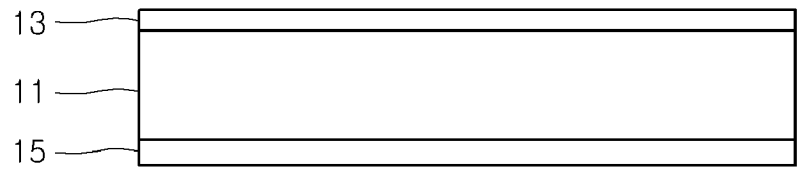
FIGS. 1 to 11 are sectional views showing the manufacturing process of a light emitting device package according to a first embodiment.

Hereinafter, the embodiments will be described in detail with reference to accompanying drawings.

In the description of the embodiments, it will be understood that, when a layer (or film), a region, a pattern, or a structure is referred to as being "on/over" or "below/under" another substrate, another layer (or film), another region, another pad, or another pattern, it can be "directly" or "indirectly" "on/over" or "below/under" the other substrate, layer (or film), region, pad, or pattern, or one or more intervening layers may also be present. Such a position of the layer has been described with reference to the drawings.

The thickness and size of each layer shown in the drawings can be exaggerated, omitted or schematically drawn for the purpose of convenience or clarity. In addition, the size of elements does not utterly reflect an actual size.

First Embodiment

FIGS. 1 to 11 are sectional views showing the manufacturing process of a light emitting device package according to a first embodiment.

First, as shown in FIG. 1, first and second masks 13 and 15 are formed on upper and lower surfaces of a semiconductor substrate 11.

Figure 2:
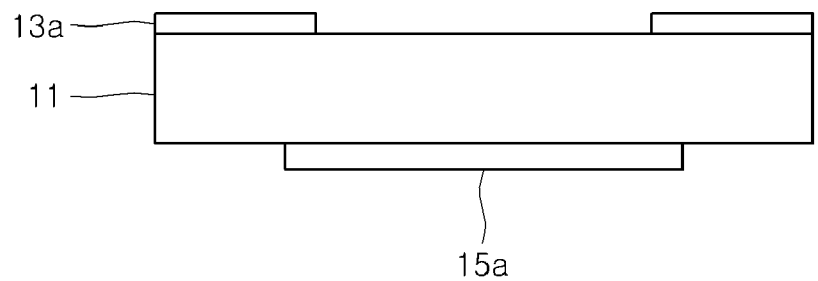

Next, as shown in FIG. 2, in order to etch the semiconductor substrate 11, a first pattern mask 13a and a second pattern mask 15a are formed. The first and second pattern masks 13a and 15a can be formed through a photolithography process.

The semiconductor substrate 11 can include single crystalline silicon, but the embodiment is not limited thereto. The semiconductor substrate 11 can be etched through a dry etching process or a wet etching process. When the semiconductor substrate 11 includes a silicon substrate, the first and second masks 13 and 15 can include a silicon nitride layer, but the embodiment is not limited. In addition, the semiconductor substrate 11 can be subject to a KOH wet etching process, but the embodiment is not limited thereto.

Figure 3:
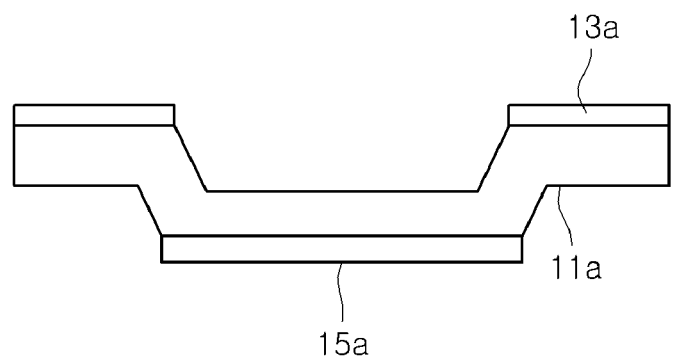

Thereafter, as shown in FIG. 3, the etching process is performed to form a first semiconductor substrate 11a having a first surface (or first groove) formed at a first depth from an upper surface thereof. In other words, the etch shape of the first semiconductor substrate 11a can be adjusted according to the alignment of the first and second pattern masks 13a and 15a. Accordingly, the first semiconductor substrate 11a can have the shape of a bathtub with the first surface formed at the first depth from the upper surface of the first semiconductor substrate 11a, but the embodiment is not limited thereto.

Figure 4:
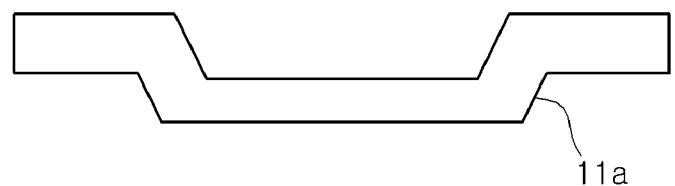

Subsequently, as shown in FIG. 4, the first and second pattern masks 13a and 15a can be removed from the first semiconductor substrate 11a. For example, the first and second pattern masks 13a and 15a can be removed through the wet etching process, but the embodiment is not limited thereto.

Figure 5:
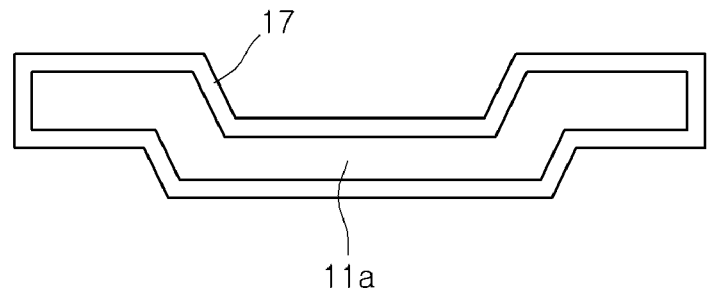

Thereafter, as shown in FIG. 5, a third mask 17 is formed on the first semiconductor substrate 11a. The third mask 17 can include a silicon nitride layer or a silicon oxide layer, but the embodiment is not limited thereto.

Figure 6:
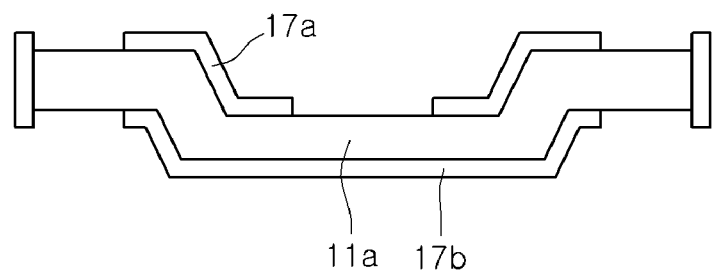

Then, as shown in FIG. 6, in order to etch the first semiconductor substrate 11a, third and fourth pattern masks 17a and 17b are formed on upper and lower surfaces of the first semiconductor substrate 11a. The third and fourth pattern masks 17a and 17b can be formed in a desired shape through a photolithography process, but the embodiment is not limited thereto.

Figure 7:
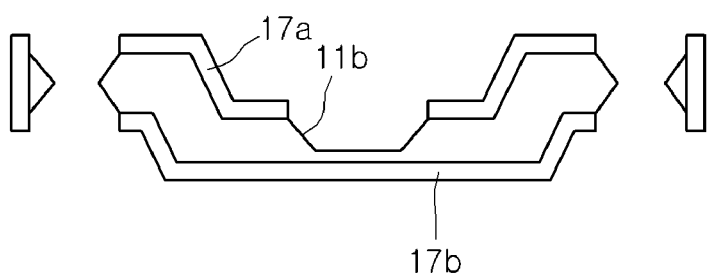

Next, as shown in FIG. 7, an etching process is performed to form a second semiconductor substrate 11b having a second surface (or a second groove) formed in the first surface at a second depth. The etch shape of the second semiconductor substrate 11b can be adjusted according to the alignment of the third and fourth pattern masks 17a and 17b. The etching process for the second semiconductor substrate 11b can be performed along to a crystal plane (e.g., (100) or (111)) of a single crystalline substrate.

Figure 8:
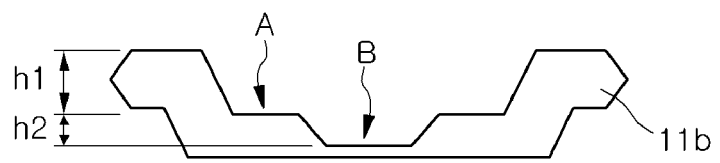

Thereafter, as shown in FIG. 8, the third and fourth pattern masks 17a and 17b can be removed.

According to the first embodiment, as shown in FIG. 8, the second semiconductor substrate 11b can have a bathtub shape, in which a first surface A having a first depth h1 on the basis of the upper surface of the semiconductor substrate 11b is formed in a first region and a second surface B having a second depth h2 is formed in a second region of the first surface A.

Figure 9:
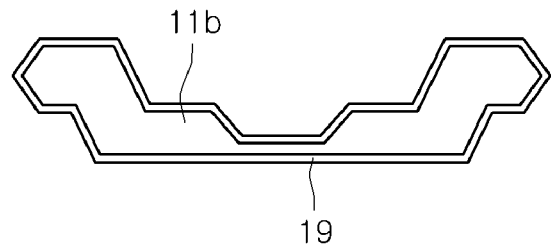

Thereafter, as shown in FIG. 9, an insulating layer 19 can be formed on the second semiconductor substrate 11b. The insulating layer 19 is formed for the electric insulation from a conductive layer formed in the subsequent process. The insulating layer 19 can include a silicon oxide layer, a silicon nitride layer, an aluminum nitride (AlN) layer, or a silicon carbide (SiC) layer, but the embodiment is not limited thereto.

Figure 10:
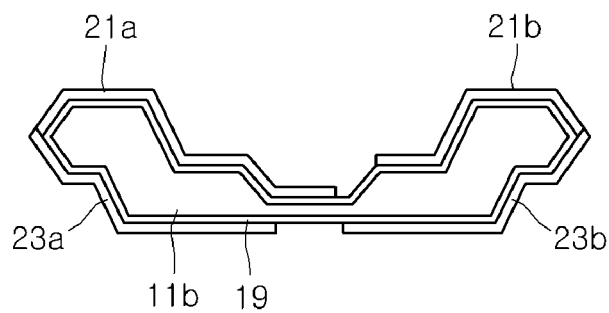

Next, as shown in FIG. 10, the conductive layer can be formed on the insulating layer 19. The conductive layer can be electrically connected to a light emitting part that is formed in the subsequent process. First and second metal layers 21a and 21b can be formed on the insulating layer 19, and third and fourth metal layers 23a and 23b can be formed below the insulating layer 19.

Figure 11:
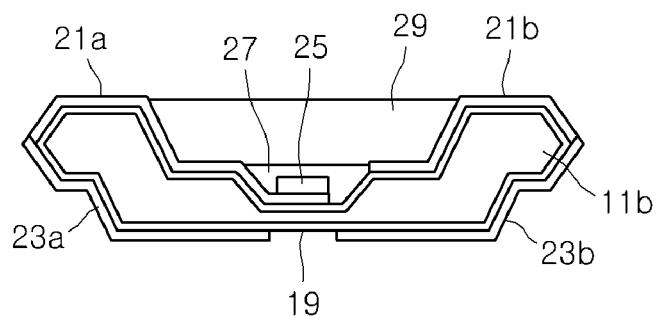

Thereafter, as shown in FIG. 11, a light emitting part 25 can be formed on the second semiconductor substrate 11b. The light emitting part 25 can be realized in the form of a light emitting diode, but the embodiment is not limited thereto. The first metal layer 21a and/or the third metal layer 23a serving as a first conductive layer can be connected to a first electrode (not shown) of the light emitting part 25, and the second metal layer 21b and/or the fourth metal layer 23b serving as a second conductive layer can be connected to a second electrode (not shown) of the light emitting part 25.

The first metal layer 21a and the second metal layer 21b formed on the upper surface of the second semiconductor substrate 11b can include a metal thin film having high reflectance, so that the light efficiency of the light emitting device package can be improved. In addition, the third metal layer 23a and the fourth metal layer 23b formed on the lower surface of the second semiconductor substrate 11b can include metal having superior adhesive strength with an adhesive such as a cream solder or the like. This can improve electric/mechanical connection with metal interconnections formed on a printed circuit board in the subsequent surface-mount technology (SMT) process.

The first and second metal layers 21a and 21b can include a plurality of metal layers, and the upper most layer thereof can include aluminum (Al), silver (Ag), or APC (Ag, Pd, Cu) metal. In addition, the third and fourth metal layers 23a and 23b can include a plurality of metal layers, and the lower most layer thereof can include gold (Au), or copper (Cu).

A phosphor 27 can be formed on the light emitting part 25, and a molding part 29 can be formed on the phosphor 27. The phosphor 27 can receive light having a first wavelength band from the light emitting part 25 and can supply light having a second wavelength band. The second wavelength band can be longer than the first wavelength band. White light can be emitted based on the light having the second wavelength band from the phosphor 27 and the light having the first wavelength band from the light emitting part 25. The molding part 29 can protect the phosphor 27 and the light emitting part 25. The molding part 29 can include silicon, but the embodiment is not limited thereto.

According to the embodiment, as shown in FIG. 11, the light emitting device package can include the second semiconductor substrate 11b, the light emitting part 25, the first metal layer 21a, the second metal layer 21b, the third metal layer 23a, the fourth metal layer 23b, the phosphor 27, the insulating layer 19, and the molding part 29.

The second semiconductor substrate 11b can be formed in the shape of a two-stage bathtub having the first surface formed at the first depth h1 from the upper surface of the second semiconductor substrate 11b and the second surface formed at the second depth h2 from the first surface. The light emitting part 25 can be formed on the second surface of the second semiconductor substrate 11b.

The first conductive layer including the first metal layer 21a and the third metal layer 23a can be connected to the first electrode of the light emitting part 25, and the second conductive layer including the second metal layer 21b and the fourth metal layer 23b can be connected to the second electrode of the light emitting part 25.

The first conductive layer can include the first metal layer 21a provided on the second semiconductor substrate 11b and the third metal layer 23a provided below the semiconductor substrate 11b. The first metal layer 21a and the third metal layer 23a can be electrically connected to each other at an outer peripheral surface of the second semiconductor substrate 11b.

The second conductive layer can include the second metal layer 21b provided on the second semiconductor substrate 11b and the fourth metal layer 23b provided below the semiconductor substrate 11b. The second metal layer 21b and the fourth metal layer 23b can be electrically connected to each other at the outer peripheral surface of the second semiconductor substrate 11b.

The phosphor 27 can be formed on the light emitting part 25, and the molding part 29 can be formed on the phosphor 27. The insulating layer 19 can be interposed between the semiconductor substrate 11b and the first conductive layer. In addition, the insulating layer 19 can be interposed between the second semiconductor substrate 11b and the second conductive layer.

According to the embodiment, a zener diode (not shown) can be formed on the second semiconductor substrate 11b. The zener diode can be integrated onto the semiconductor substrate 11b by forming a diode pattern and performing a diffusion process or an ion implantation process for the resultant structure after the insulating layer 19 has been formed, but the embodiment is not limited thereto. As the zener diode is formed, the withstanding voltage of the light emitting device package according to the embodiment can be improved. In addition, according to the embodiment, electronic elements such as a resistor or a capacitor can be integrated into the light emitting device package.

In the light emitting device package according to the embodiment, a mounting region for the light emitting part 25 is formed in the shape of the two-stage bathtub, so that the light emitting part 25 is mounted on the second surface, which is formed at the bottom of the two-stage bathtub, and the first and second metal layers 21a and 21b having high reflectance can be formed on the first surface. Accordingly, light, which is emitted from the light emitting part 25 but cannot be transmitted through a light exit surface (an outer portion of the light emitting device package), is reflected toward the first surface, and light reflected from the first surface is emitted out of the light emitting device package without being incident onto the light emitting part 25, thereby improving light efficiency.

In addition, the distance between a reflective surface, such as a (111) surface formed between the first surface and the second surface, and the light emitting part 25, and the height of the phosphor 27 provided at the upper portion of the light emitting part 25 can be reduced. Accordingly, the light emitted from the light emitting part 25 can be transmitted through the phosphor 27 without causing difference in optical path in all directions around the light emitting part 25, so that color deviation caused by orientation angles of the light can be reduced, thereby supplying high-quality light.

Second Embodiment

Figure 12:
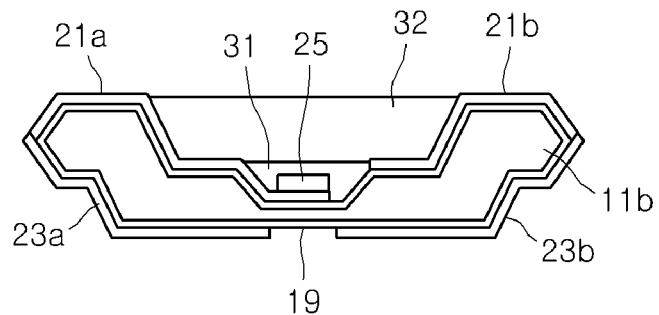
FIG. 12 is a sectional view showing a light emitting device package according to a second embodiment.

FIG. 12 is a sectional view showing a light emitting device package according to a second embodiment.

The light emitting device package according to the second embodiment includes the second semiconductor substrate 11b, the light emitting part 25, the first metal layer 21a, the second metal layer 21b, the third metal layer 23a, the fourth metal layer 23b, a first molding part 31, a second molding part 32, and the insulating layer 19.

The second embodiment can employ the technical features of the first embodiment, so the second embodiment will be described while focusing on the features distinguished from the first embodiment.

Different from the first embodiment, according to the second embodiment, a phosphor is provided in the second molding part 32. For example, the first molding part 31 can be formed on the light emitting part 25, and the second molding part 32 can be formed on the first molding part 31. The second molding part 32 can include a second phosphor. The first molding part 31 can be filled with transparent silicon gel. In addition, the first molding part 31 can include a first phosphor.

According to the second embodiment, since the second molding part 32 can include a phosphor, thereby realizing a remove phosphor structure in which the light emitting part 25 is spaced apart from the second molding part 32 including a phosphor to improve light efficiency.

Third Embodiment

Figure 13:
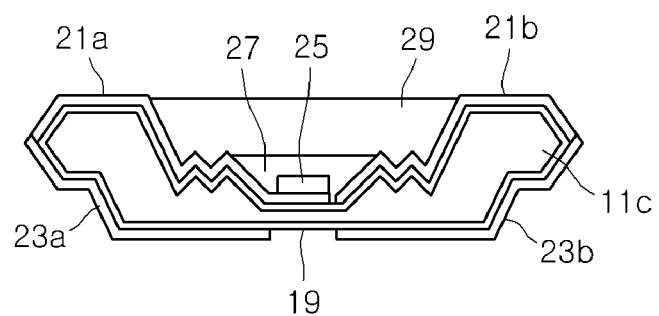
FIG. 13 is a sectional view showing a light emitting device package according to a third embodiment.

FIG. 13 is a sectional view showing a light emitting device package according to a third embodiment.

The third embodiment can employ the technical features of the first embodiment, so that the third embodiment will be described while focusing on the features distinguished from the first embodiment.

When compared to the first embodiment, the third embodiment employs a third semiconductor substrate 11c having a first surface in a concave-convex shape. For example, when a second surface of the third semiconductor substrate 11c is formed, the second surface having the second depth is formed in a second region of the first surface, and a third surface having a concave-convex shape is formed in a third region of the first surface, thereby forming the third semiconductor substrate 11c having a concave-convex shape as shown in FIG. 13. The concave-convex shape can include a V-shape groove, but the embodiment is not limited thereto.

According to the third embodiment, the V-shape groove is formed on the first surface, so that light, which does not escape from the light emitting device package but is reflected toward the first surface, is reflected from a concave-convex surface with a changed reflection angle to increase the probability in which the light is emitted from the light emitting device package. Therefore, light efficiency can be more improved.

Fourth Embodiment

Figure 14:
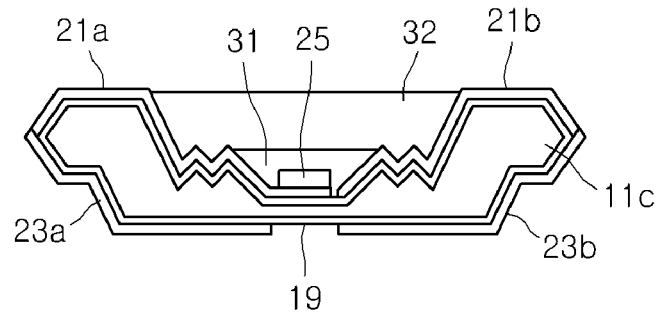
FIG. 14 is a sectional view showing a light emitting device package according to a fourth embodiment.

FIG. 14 is a sectional view showing a light emitting device package according to a fourth embodiment.

The fourth embodiment can employ the technical features of the second embodiment, so that the fourth embodiment will be described while focusing on the features distinguished from the second embodiment.

Different from the second embodiment, the first surface of the semiconductor substrate 11c can have a concave-convex pattern according to the fourth embodiment.

For example, when the second surface of the semiconductor substrate 11c is formed, the second surface having the second depth is formed in the second region of the first surface, and a third surface having a concave-convex shape is formed in the third region of the first surface, thereby forming the semiconductor substrate 11c having a concave-convex pattern as shown in FIG. 14.

According to the fourth embodiment, the V-shape groove is formed on the first surface, so that light, which does not escape from the light emitting device package but is reflected toward the first surface, is reflected from a concave-convex surface with a changed reflection angle to increase the probability in which the light is emitted from the light emitting device package. Therefore, light efficiency can be more improved.

According to the fourth embodiment, the second molding part 32 includes a phosphor, thereby realizing a remove phosphor structure in which the light emitting part 25 is spaced apart from the second molding part 32 including the phosphor, so that light efficiency can be improved.

Fifth Embodiment

Figure 15:
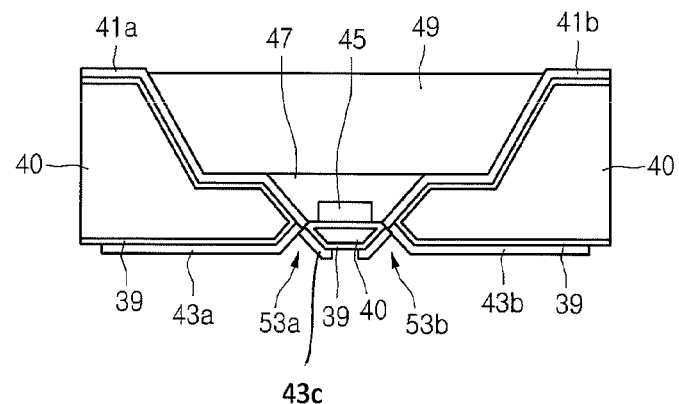
FIG. 15 is a sectional view showing a light emitting device package according to a fifth embodiment.

FIG. 15 is a sectional view showing a light emitting device package according to a fifth embodiment.

The fifth embodiment can employ the technical features of the first embodiment, so that the fifth embodiment will be described while focusing on the features distinguished from the first embodiment.

According to the fifth embodiment, the light emitting device package includes a semiconductor substrate 40, a light emitting part 45, a first metal layer 41a, a second metal layer 41b, a third metal layer 43a, a fourth metal layer 43b, a phosphor 47, an insulating layer 39, and a molding part 49.

When comparing with the first embodiment, the fifth embodiment has difference in that first and second via holes 53a and 53b are formed in the semiconductor substrate 40.

For example, the first metal layer 41a can be electrically connected to the third metal layer 43a through the first via hole 53a formed in the second surface of the semiconductor substrate 40. In addition, the second metal layer 41b is electrically connected to the fourth metal layer 43b through the second vial hole 53b formed in the second surface of the semiconductor substrate 40. A fifth metal layer 43c can be disposed between the third metal layer 43a and the fourth metal layer 43b.

According to the fifth embodiment, when the second surface of the semiconductor substrate 40 is formed, the second surface having the second depth is formed in the second region of the first surface, and the first and second vial holes 53a and 53b can be formed in the second surface through the semiconductor substrate 40.

A desirable etching mask pattern is formed on the upper and lower surfaces of the semiconductor substrate 40, and the etching process for the upper and lower surfaces of the semiconductor substrate 40 is performed, thereby realizing the semiconductor substrate 40 including the first and second via holes 53a and 53b.

According to the embodiment, the first conductive layer is electrically connected to the second conductive layer through the first via hole 53a or the second via hole 53b, so that a small-scale light emitting device package can be formed.

Sixth Embodiment

Figure 16:
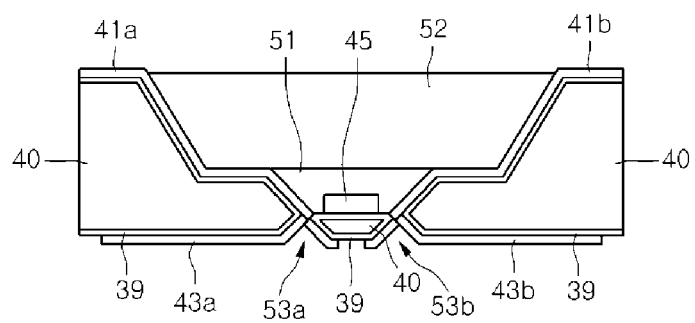
FIG. 16 is a sectional view showing a light emitting device package according to a sixth embodiment.

FIG. 16 is a sectional view showing a light emitting device package according to a sixth embodiment.

The sixth embodiment can employ the technical features of the fifth embodiment, so that the sixth embodiment will be described while focusing on the features distinguished from the fifth embodiment.

The light emitting device package according to the sixth embodiment can include the semiconductor substrate 40, the light emitting part 45, the first metal layer 41a, the second metal layer 41b, the third metal layer 43a, the fourth metal layer 43b, a first molding part 51, a second molding part 52, and the insulating layer 39.

When compared to the fifth embodiment, the sixth embodiment can employ the second molding part 52 having a phosphor. For example, the first molding part 51 can be formed on the light emitting part 45, and the second molding part 52 can be formed on the first molding part 51. The second molding part 52 can include the second phosphor. The first molding part 51 can be filled with transparent silicon gel, but the embodiment is not limited thereto. In addition, the first molding part 31 can include the first phosphor.

According to the sixth embodiment, the second molding part 32 includes a phosphor, thereby realizing a remove phosphor structure in which the light emitting part 45 is spaced apart from the second molding part 32 including the phosphor, so that light efficiency can be improved.

According to the sixth embodiment, the first conductive layer can be electrically connected to the second conductive layer through the first via hole 53a or the second via hole 53b, so that a small-scale light emitting device package can be formed.

Seventh Embodiment

Figure 17:
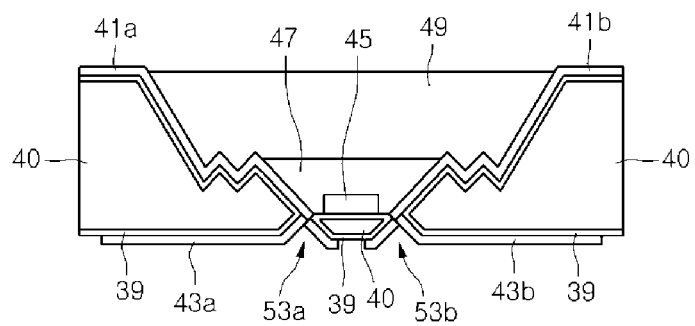
FIG. 17 is a sectional view showing a light emitting device package according to a seventh embodiment.

FIG. 17 is a sectional view showing a light emitting device package according to a seventh embodiment.

The seventh embodiment can employ the technical features of the fifth embodiment, so that the seventh embodiment will be described while focusing on the features distinguished from the fifth embodiment.

When compared to the fifth embodiment, the seventh embodiment can employ the semiconductor substrate 40 having the first surface in a concave-convex shape.

When the second surface of the semiconductor substrate 40 is formed, the second surface having the second depth can be formed in the second region of the first surface, and the third surface having a concave-convex shape can be formed in the third region of the first surface, so that the semiconductor substrate 40 having a concave-convex shape can be formed.

According to the seventh embodiment, the V-shape groove can be formed in the first surface, so that light, which does not escape from the light emitting device package but is reflected toward the first surface, can be reflected from the concave-convex surface with a changed reflection angle to increase the probability in which the light is emitted from the light emitting device package. Therefore, light efficiency can be more improved.

Eighth Embodiment

Figure 18:
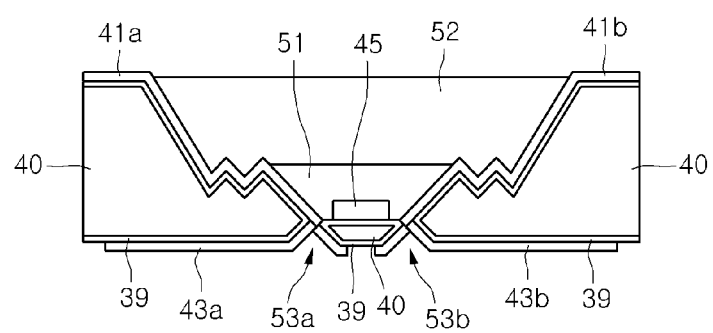
FIG. 18 is a sectional view showing a light emitting device package according to an eighth embodiment.

FIG. 18 is a sectional view showing a light emitting device package according to an eighth embodiment.

The eighth embodiment can employ the technical features of the sixth embodiment, so that the eighth embodiment will be described while focusing on the features distinguished from the sixth embodiment will be mainly described.

When compared to the sixth embodiment, the eighth embodiment can employ the semiconductor substrate 40 having the first surface in the concave-convex shape.

When the second surface of the semiconductor substrate 40 is formed, the second surface having the second depth can be formed in the second region of the first surface, and the third surface having a concave-convex shape can be formed in the third region of the first surface, so that the semiconductor substrate 40 having a concave-convex shape can be formed.

According to the eighth embodiment, the V-shape groove can be formed in the first surface, so that light, which does not escape from the light emitting device package but is reflected toward the first surface, can be reflected from the concave-convex surface with a changed reflection angle to increase the probability in which the light is emitted from the light emitting device package. Therefore, light efficiency can be more improved.

According to the eighth embodiment, the second molding part 52 can include a phosphor, thereby realizing a remove phosphor structure in which the light emitting part 45 is spaced apart from the second molding part 52 including the phosphor, so that light efficiency can be improved.

As described above, in the light emitting device package according to the embodiments, the light efficiency can be improved, and the color deviation can be reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a substrate including a top surface, a bottom surface, and an inner side surface between the top surface and the bottom surface, the inner side surface including a flat portion being parallel to the bottom surface to form a first cavity recessed from the top surface;
   a second cavity directly on the first cavity, a center axis of the second cavity being the same as a center axis of the first cavity such that both the first cavity and the second cavity having bilateral symmetry;
   a light emitting part on the second cavity, the flat portion of the inner side surface being closer to the light emitting part than to the top surface of the substrate;
   a first metal layer on the inner side surface of the substrate, the first metal layer electrically connected to the light emitting part;
   a second metal layer on the inner side surface of the substrate, the second metal layer electrically connected to the light emitting part;
   a third metal layer on the bottom surface of the substrate, the third metal layer electrically connected to the first metal layer by a first via hole;
   a fourth metal layer on the bottom surface of the substrate, the fourth metal layer electrically connected to the second metal layer by a second via hole; and
   a fifth metal layer on the bottom surface of the substrate, the fifth metal layer disposed between the first via hole and the second via hole.

2. The light emitting device package of claim 1, wherein the fifth metal layer is disposed between the first metal layer and the second metal layer.

3. The light emitting device package of claim 1, wherein the fifth metal layer is disposed between the third metal layer and the fourth metal layer.

4. The light emitting device package of claim 1, wherein the first via hole and the second via hole are disposed lower than the light emitting part.

5. The light emitting device package of claim 1, wherein a bottom surface of the third metal layer is lower than a bottom surface of the light emitting part.

6. The light emitting device package of claim 1, wherein a bottom surface of the fourth metal layer is lower than a bottom surface of the light emitting part.

7. The light emitting device package of claim 1, wherein the first via hole and the second via hole are disposed at an outer area of the light emitting part.

8. The light emitting device package of claim 1, wherein the fifth metal layer is not electrically connected to the first metal layer.

9. The light emitting device package of claim 1, wherein the fifth metal layer is not electrically connected to the second metal layer.

10. The light emitting device package of claim 1, wherein the light emitting part is disposed between the first via hole and the second via hole.

11. The light emitting device package of claim 1, wherein the light emitting part is disposed between the first metal layer and the second metal layer.

12. The light emitting device package of claim 1, wherein the light emitting part is disposed between the third metal layer and the fourth metal layer.

13. The light emitting device package of claim 1, wherein the light emitting part is not vertically overlapped with the first via hole.

14. The light emitting device package of claim 1, wherein the light emitting part is not vertically overlapped with the second via hole.

15. The light emitting device package of claim 1, wherein the light emitting part is not vertically overlapped with the first metal layer.

16. The light emitting device package of claim 1, wherein the light emitting part is not vertically overlapped with the second metal layer.

17. The light emitting device package of claim 1, wherein the light emitting part is not vertically overlapped with the fifth metal layer.

18. The light emitting device package of claim 1, wherein a top surface of the light emitting part is lower than a bottom surface of the first cavity.

19. The light emitting device package of claim 1, wherein a width of the first cavity is wider than a width of the second cavity.

20. The light emitting device package of claim 1, wherein the first via hole and the second via hole pass through a part of the substrate.

* * * * *